United States Patent [19]
Komai et al.

[11] Patent Number: 6,069,829
[45] Date of Patent: May 30, 2000

[54] INTERNAL CLOCK MULTIPLICATION FOR TEST TIME REDUCTION

[75] Inventors: Yutaka Komai, Ibaraki, Japan; Roger Norwood, McKinney; Daniel B. Penny, Houston, both of Tex.

[73] Assignee: Texas Instruments Incorporated, Dallas, Tex.

[21] Appl. No.: 09/408,093

[22] Filed: Sep. 27, 1999

Related U.S. Application Data

[60] Provisional application No. 60/102,295, Sep. 29, 1998.

[51] Int. Cl.$^7$ .................................................. G11C 29/00
[52] U.S. Cl. ......................... 365/201; 365/233; 365/236; 365/189.08; 365/230.03; 714/719; 714/718
[58] Field of Search .................................... 365/201, 233, 365/236, 189.08, 230.03, 190, 194, 189.07, 220; 714/718, 719, 722

[56] References Cited

U.S. PATENT DOCUMENTS

| | | | |
|---|---|---|---|
| 5,991,213 | 11/1999 | Cline et al. ............................. | 365/201 |
| 5,995,426 | 11/1999 | Cowles et al. ........................... | 365/201 |
| 6,009,026 | 12/1999 | Tamlyn et al. ........................... | 365/201 |
| 6,014,336 | 1/2000 | Powell et al. ........................... | 365/201 |
| 6,016,561 | 1/2000 | Roohparvar et al. .................... | 714/720 |
| 6,026,039 | 2/2000 | Kim et al. ................................. | 365/201 |

*Primary Examiner*—Andrew Q. Tran
*Attorney, Agent, or Firm*—Robert N. Roundtree; Robby T. Holland; Frederick J. Telecky, Jr.

[57] ABSTRACT

A circuit is designed with a clock circuit (215, 217) coupled to receive a control signal having a first logic state and a second logic state. The clock circuit produces a first clock signal (CLK) response to the first logic state and a second clock signal (*CLK) in response to the second logic state. The second clock signal has a frequency at least twice a frequency of the first clock signal. An address counter (221) is coupled to receive one of the first and second clock signals. The address counter produces a sequence of address signals corresponding to the one of the first and second clock signals. An array of memory cells is arranged to produce a sequence of data bits corresponding to the sequence of address signals. A logic circuit (235, 239, 240) is coupled to receive the sequence of data bits. The logic circuit produces a logical combination of the sequence of data bits.

21 Claims, 6 Drawing Sheets

INTERNAL CLOCK MULTIPLICATION FOR TEST TIME REDUCTION

This application claims priority under 35 USC § 119(e)(1) of provisional application Ser. No. 60/102,295, filed Sep. 29, 1998.

FIELD OF THE INVENTION

This invention relates to an integrated circuit and more particularly to an integrated circuit with design-for-test (DFT) circuits.

BACKGROUND OF THE INVENTION

Present complementary metal oxide semiconductor (CMOS) synchronous dynamic random access memory (SDRAM) circuits are frequently used for main memory in a variety of applications including desk top and portable computer systems. Advances in system technology require ever increasing clock rates and memory bus widths to achieve high data rates. Both of these methods, impose equally demanding limitations on memory testers that must guarantee functionality of the memory circuits under all conditions. Previous memory design-for-test circuits have logically combined multiple data bits extracted from a memory array in parallel to produce an equivalent compressed bit. The memory tester evaluated this representative compressed bit of the multiple data bits, thereby reducing the apparent size of the memory circuit to be tested. But this test method is still inefficient due to the greater operating speed of state-of-the-art memory circuit than of current memory testers. Current memory testers, therefore, significantly constrain memory circuit production. An upgrade of memory testers, however, would require a significant expenditure of capital.

This limitation of memory testers is particularly apparent for synchronous dynamic random access memory (SDRAM) circuits operating in burst mode. An SDRAM circuit receives initial row and column address signals in a burst read cycle. An internal address counter increments this initial address to produce parallel sequences of data bits corresponding to each bit position of a data word in synchronization with a system clock signal. Although, the SDRAM circuit may potentially operate faster than the memory tester, both input and output data rates of the sequences of data bits are limited by the speed of the memory tester. Thus, the memory tester severely limits SDRAM production even with highly parallel DFT circuits of the prior art.

SUMMARY OF THE INVENTION

These problems are resolved by a circuit, comprising a clock circuit coupled to receive a control signal having a first logic state and a second logic state. The clock circuit produces a first clock signal in response to the first logic state and a second clock signal in response to the second logic state. The second clock signal has a frequency that is at least twice a frequency of the first clock signal. An address counter is coupled to receive one of the first and second clock signals and produces a sequence of address signals corresponding to the one of the first and second clock signals. An array of memory cells is arranged to produce a sequence of data bits corresponding to the sequence of address signals. A logic circuit is coupled to receive the sequence of data bits and produce a logical combination of the sequence of data bits.

The present invention provides highly parallel data compression in the X, Y and Z dimensions over time. Multiple data bits of a sequence are read from a memory array at a first data rate, compressed and produced at an output terminal at a second data rate.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
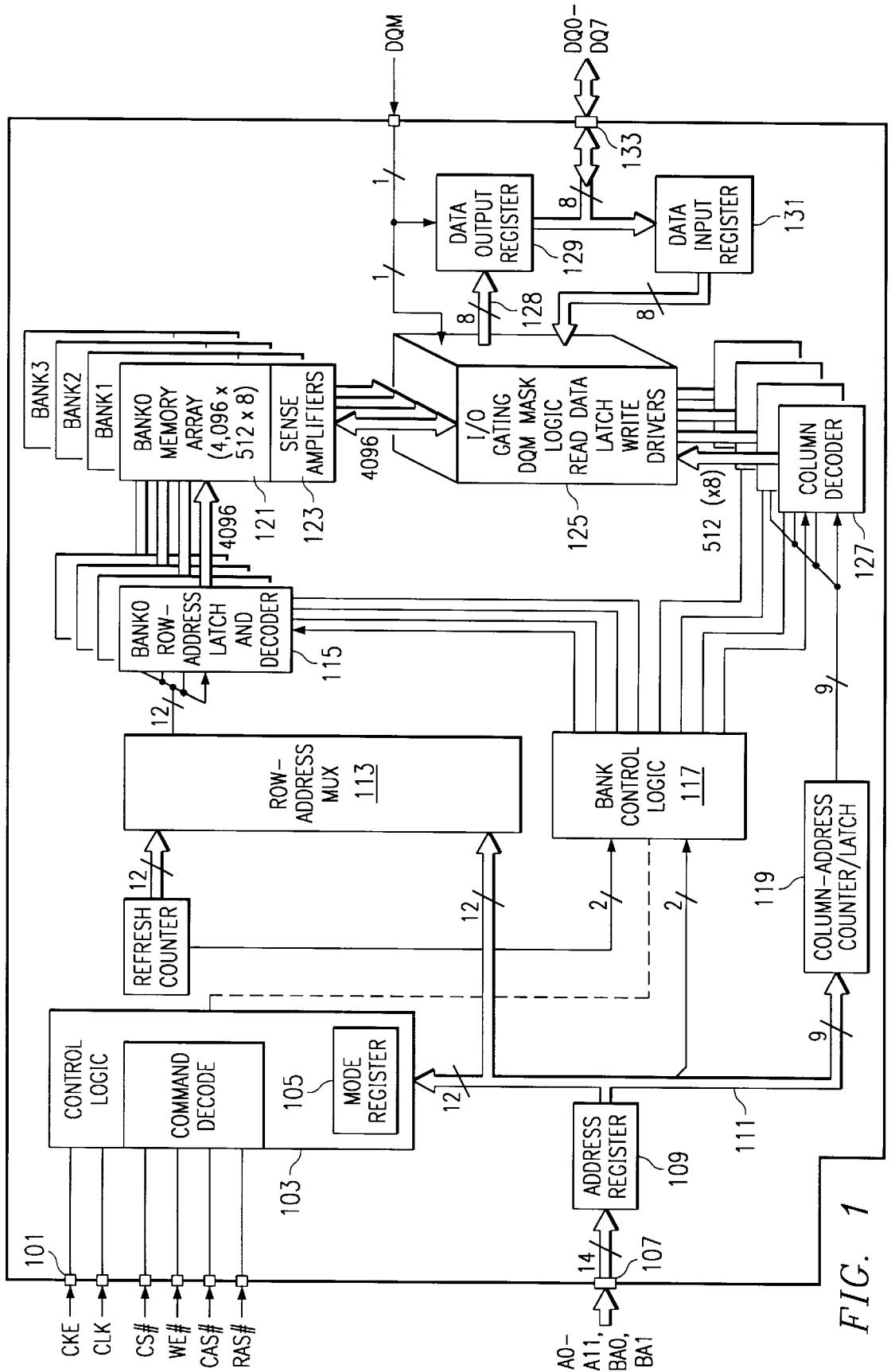
FIG. 1 is a functional block diagram of a memory circuit that may employ internal clock multiplication according to the present invention.

Referring now to FIG. 1, there is a functional block diagram of a memory circuit that may employ internal clock multiplication according to the present invention. A control logic section 103 of the memory circuit receives control signals including clock enable signal CKE, system clock signal CLK, row address strobe RAS# and column address strobe CAS# at terminals 101 for controlling operation of the memory circuit. Address register 109 receives address signals A0–A11 and bank address signals BA0 and BA1 at terminals 107. During normal operation, the bank address signals are applied to bank control logic 117 for activating a bank of memory cells 121. Each bank of memory cells is arranged in rows and columns or X and Y dimensions of memory cells. The memory circuit is further arranged in four banks or a Z dimension. The row address signals are applied to respective row address latch and decode circuits 115 via row address mux 113 for selecting a word line within an active bank of memory cells. The column address signals are applied to column address counter and latch circuit 119. The column address counter loads an initial column address and produces a sequence of address signals in synchronization with the system clock signal during burst read and write modes of operation. This sequence of addresses is applied to column decode circuit 127 for selecting memory cells from a selected word line of an active bank. These selected memory cells produce or receive data bits via data output register 129 or data input register 131, respectively, at data terminals 133.

Figure 2:
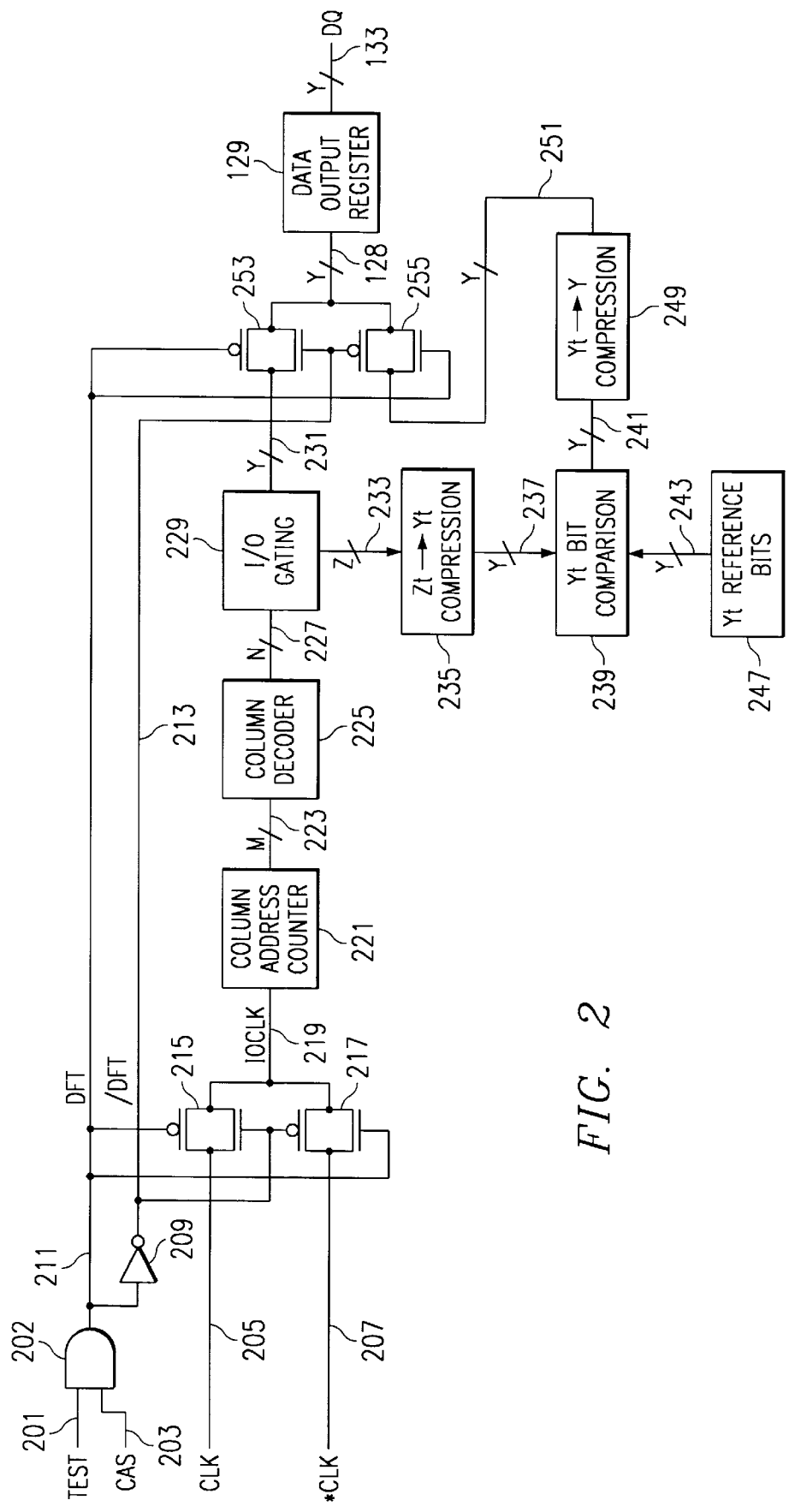
FIG. 2 is a functional block diagram of a data compression circuit of the present invention.

Turning now to FIG. 2, internal clock multiplication and data compression of the present invention will be explained in detail. Control logic section 103 generates a high-level control signal TEST at terminal 201 during a parallel test operation. Bank control logic 117 activates all four banks of memory cells for parallel operation in response to control signal TEST. Rows and columns having the same logical addresses are activated in the banks, thereby producing eight bits of parallel data from each of the four banks. Control signal TEST and control signal CAS are applied to AND gate 202 to produce control signal DFT and complementary control signal/DFT. A low logic state of control signal DFT turns on CMOS pass gate 215, thereby conducting clock signal CLK to clock signal IOCLK at terminal 219. A high level of control signal DFT, however, turns on CMOS pass gate 217, thereby conducting multiplied clock signal *CLK to clock signal IOCLK for parallel test operations. This multiplied clock signal *CLK has a frequency that is preferably an integral multiple of at least twice a frequency of clock signal CLK. This multiplied frequency of clock signal IOCLK is applied to column address counter 221. Column address counter 221 subsequently applies M column address signals for each cycle of burst mode operation at the multiplied rate to column decoder 225. Column decoder 225 then applies N column select signals for each cycle at the multiplied rate to I/O gating logic 229. During normal operation, I/O gating logic 229 would apply, for example, a four-word burst of eight parallel data bits each to data output register 129 via Y CMOS pass gates 253. This four-word burst sequence over time is denoted Yt.

During parallel test, however, I/O gating logic 229 produces Y*4 or Z bits of data on bus 233 for each multiplied clock cycle and Zt bits of data for the duration of the burst. I/O gating logic 229 applies this product of four banks, eight bits and a four-word burst over four multiplied clock cycles or one hundred twenty-eight bits to Zt to Yt compression circuit 235. The Zt to Yt compression circuit 235 converts a corresponding bit from each bank to one equivalent bit. Thus, one hundred twenty-eight bits are converted to thirty-two equivalent bits or one eight-bit word for each of four multiplied clock cycles. In a preferred embodiment of the present invention, these Yt bits are then compared to Yt corresponding reference bits to identify potential data errors. The Yt reference bits are loaded in temporary storage registers prior to the burst read cycle and remain available until a test of a new data sequence requires writing new reference bits. The compared Yt bits are then applied to a Yt to Y compression circuit 249. This compression circuit, for example, converts each sequence of two eight-bit words to a single eight-bit word when the multiplied clock has a frequency that is twice the frequency of system clock signal CLK. This single eight-bit word is conducted by Y CMOS pass gates 255 to data output register 129 for production at output terminals 133 at a time corresponding to a cycle of system clock signal CLK.

This internal clock frequency multiplication is highly advantageous for test efficiency and for test time reduction. Test efficiency is greatly improved, since the memory circuit operates at the multiplied internal clock frequency while the memory tester operates at the system clock frequency. Thus, a slower memory tester operating at one-half the clock frequency of the memory circuit is still effective for testing state-of-the-art circuits. Test time is greatly reduced over previous methods. Highly parallel compression of memory bits in X, Y and Z dimensions are further compressed in time by a factor equal to a ratio of the system clock frequency divided by the multiplied clock frequency, preferably at least one-half.

Figure 3A:
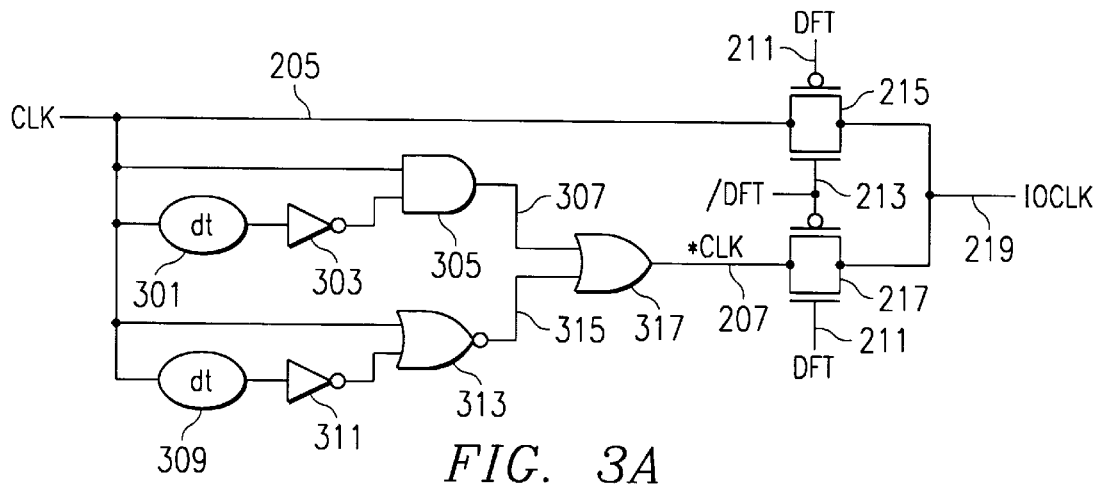
FIG. 3A–3B is an embodiment of an internal clock multiplication circuit of the present invention.
Figure 3B:
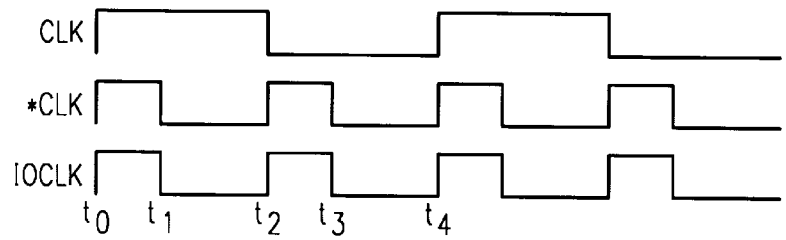

Turning now to FIG. 3A, an internal clock multiplication circuit of the present invention will be explained with reference to the timing diagram of FIG. 3B. The clock multiplication circuit receives a rising edge of system clock signal CLK on lead 205 at time t0. A rising-edge pulse generating circuit formed by AND gate 305, delay circuit 301 and inverter 303 produces a high-level pulse on lead 307 having a duration from time t0 to time t1 in response to the rising edge of system clock signal CLK. This high-level pulse is conducted to multiplied clock signal *CLK on lead 207 by OR gate 317. A subsequent falling edge of system clock signal CLK at time t2 is applied to a falling-edge pulse generating circuit formed by NOR gate 313, delay circuit 309 and inverter 311. This falling-edge pulse generating circuit produces a high-level pulse on lead 315 having a duration from time t2 to time t3 in response to the falling edge of system clock signal CLK. This high-level pulse is also conducted to multiplied clock signal *CLK on lead 207 by OR gate 317. The cycle repeats at time t4, thereby producing a multiplied clock signal *CLK having a frequency that is twice the frequency of system clock signal CLK. In parallel test mode operation, control signal DFT is high and complementary control signal/DFT is low, thereby turning on CMOS pass gate 217 and conducting multiplied clock signal *CLK to internal clock signal IOCLK.

Figure 6:
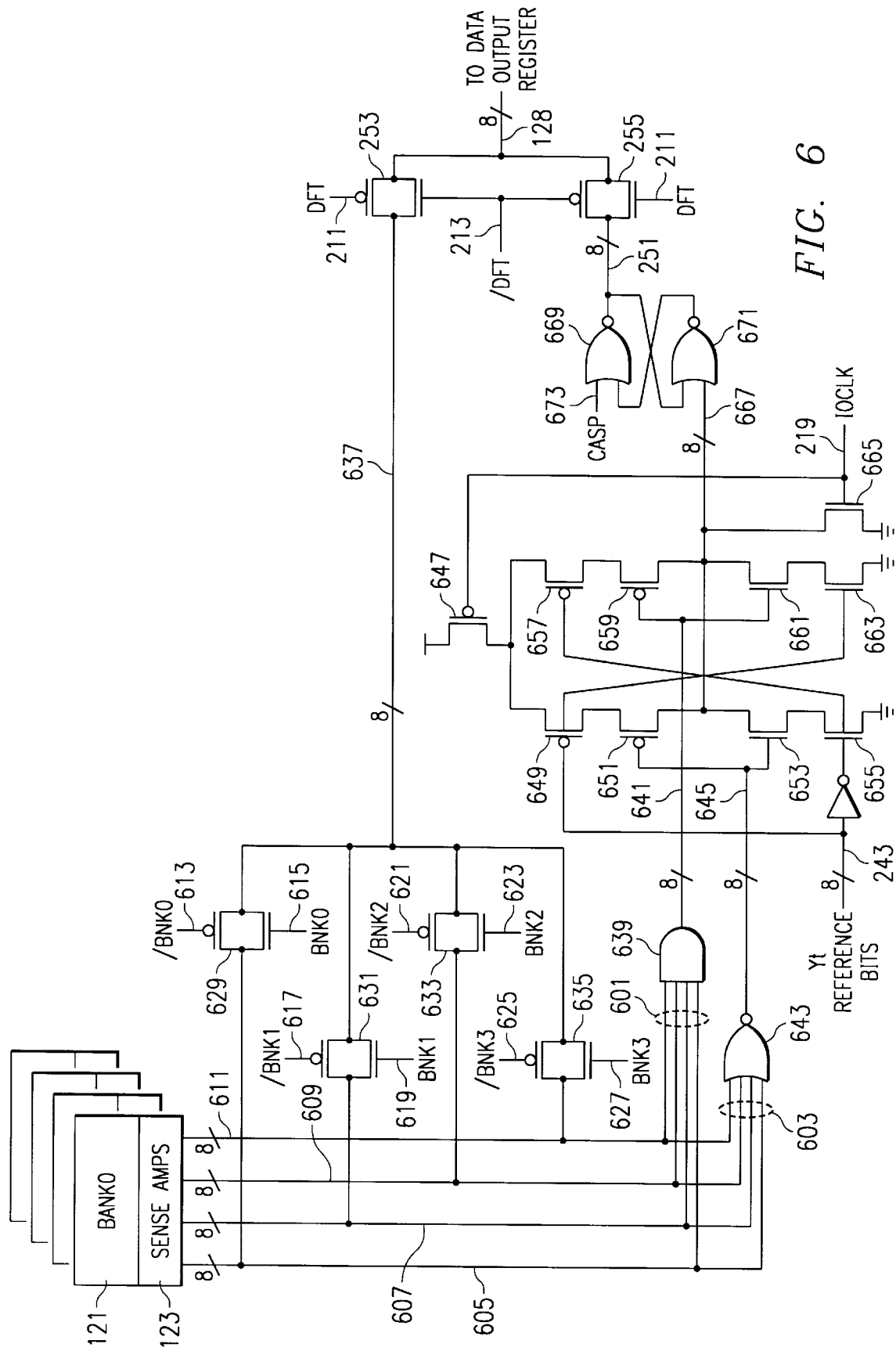
FIG. 6 is a schematic diagram of the data compression circuit of FIG. 2.

Referring now to FIG. 6, the data compression circuit of FIG. 2 will be explained in detail. In parallel test mode, each of four banks of memory cells 121 and sense amplifiers 123 simultaneously produces a respective eight-bit word on buses 605, 607, 609 and 611 for each cycle of multiplied clock signal *CLK. The Zt to Yt compression of one hundred twenty-eight bits to thirty-two bits is performed by eight AND gates 639 and eight NOR gates 643 over four cycles of multiplied clock signal *CLK. Thus, thirty-two bits are converted to eight bits each cycle of multiplied clock signal *CLK. Each AND gate 639 performs a logical AND function on a respective bit from each bank. Each corresponding NOR gate 643 performs a logical NOR function on the same respective bit from each bank. Eight complex gates formed by transistors 649–663 receive logic signals from respective AND and NOR gates and perform a Yt bit comparison with reference bits on bus 243. Each complex gate includes two tristate inverters having a common output on bus 667. Each complex gate is enabled by a falling edge of internal clock signal IOCLK at lead 219 which turns off transistor 665 and turns on transistor 647. Operation of the complex gate is explained with reference to Table I.

TABLE I

| REF | AND | NOR | 667 | 128 |
|---|---|---|---|---|
| 0 | x | 0 | 1 | 1 |
| 0 | x | 1 | 0 | 0 |
| 1 | 0 | x | 1 | 1 |
| 1 | 1 | x | 0 | 0 |

A first tristate inverter formed by transistors 649–655 is enabled by a low-level reference bit on bus 243 as indicated in the top half of Table I. The output signal on bus 667 is then the complement of the NOR output, and the AND output is a "don't care" term. For the case where there is no data error, each NOR input matches the low state of the reference bit, and the corresponding NOR output is high. If any data bit is different from the reference bit, however, the NOR output is low, thereby indicating a data error. Alternatively, a high-level reference bit on bus 243 enables a second tristate inverter formed by transistors 657–663 as indicated in the bottom half of Table I. The output signal on bus 667 is then the complement of the AND output, and the NOR output is a "don't care" term. For the case where there is no data error, each AND input matches the high state of the reference bit, and the corresponding AND output is high. If any data bit is different from the reference bit, however, the AND output is low, thereby indicating a data error. Thus, a low logic level on output bus 667 indicates a correct data state for each cycle of the internal clock signal IOCLK.

The output signal on bus 667 is applied to eight flip-flops formed by cross-coupled NOR gates 669 and 667 for performing the Yt to Y compression of the burst of data. The latch is initially set to a low output state on bus 675 by a high-level column address strobe pulse CASP on lead 673 prior to the burst read operation. A high level of internal clock signal IOCLK turns on transistor 665, thereby holding the signal on bus 667 low. A low level of internal clock signal IOCLK enables the complex gate and presents bit comparison results to the latch as previously described. A high level on bus 667 for any cycle of internal clock IOCLK, indicating a data error, will reset the latch formed by cross-coupled NOR gates 669 and 671, thereby producing a high output signal on bus 128 via CMOS pass gate 255. This high level error signal on bus 128 is subsequently produced at data output terminals 133 and detected by the memory tester during the next read operation or data strobe corresponding to a system clock cycle. Thus, an error during a burst read operation corresponding to any cycle of internal clock signal IOCLK is detected by the memory tester during a subsequent cycle of system clock signal CLK.

A parallel write operation is conducted in the same manner as with conventional parallel test operations. External data bits are applied to respective data terminals 133 for the duration of a burst write operation. Parallel data paths are activated in response to control signal DFT, thereby writing data to memory cells at the multiplied clock frequency. Both read and write burst operations at the multiplied clock frequency, therefore, are compatible with a memory tester operating at a substantially lower system clock frequency. Thus, test time is significantly reduced. Memory test time is limited by the speed of the memory circuit rather than the speed of the memory tester. Moreover, the lifetime of slower memory testers is prolonged, since they need not operate at the same clock frequency as the memory circuit.

Figure 4:
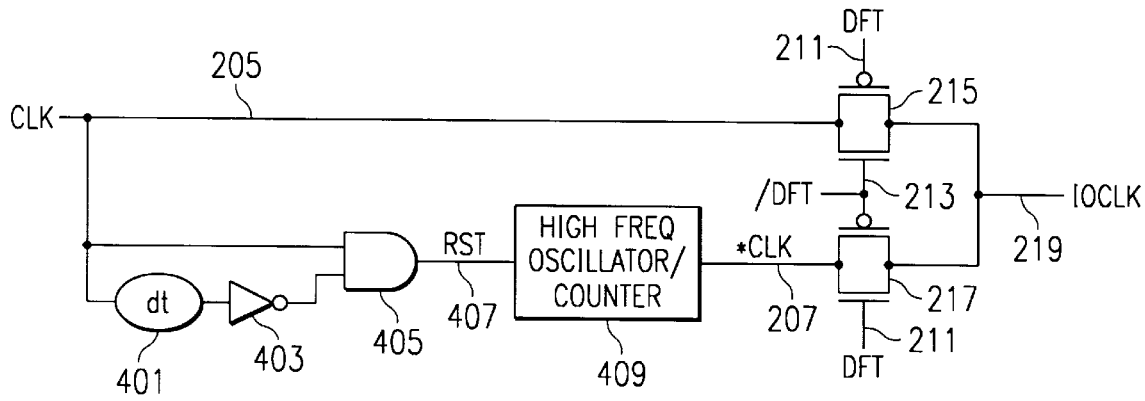
FIG. 4 is another embodiment of an internal clock multiplication circuit of the present invention.

Although the invention has been described in detail with reference to its preferred embodiment, it is to be understood that this description is by way of example only and is not to be construed in a limiting sense. For example, another embodiment of the multiplied clock generator circuit is shown in FIG. 4. A system clock signal CLK is applied to a pulse generator circuit formed by AND gate 405, delay circuit 401 and inverter 403 for generating reset pulse signal RST. This reset pulse signal RST resets high frequency oscillator/counter circuit 409 to an initial count for a frequency that is an integral multiple of the system clock signal CLK frequency. The high frequency oscillator/counter circuit produces a predetermined number of cycles of multiplied clock signal *CLK that are conducted to internal clock signal IOCLK via CMOS pass gate 217. A subsequent low-to-high transition of system clock signal CLK resets the high frequency oscillator/counter circuit and the process is repeated.

Figure 5A:
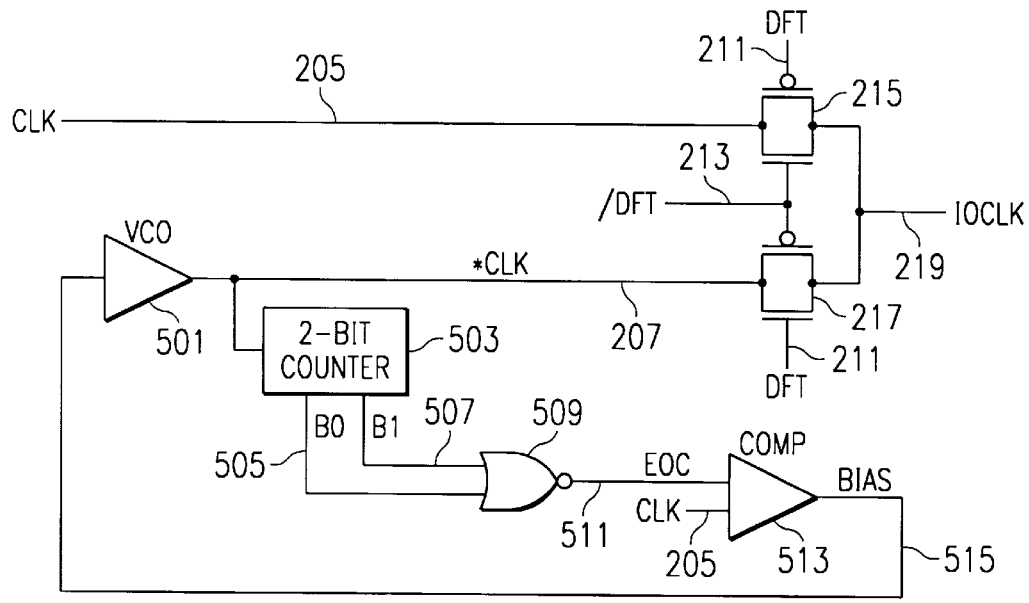
FIG. 5A–5C is yet another embodiment of an internal clock multiplication circuit of the present invention.
Figure 5B:
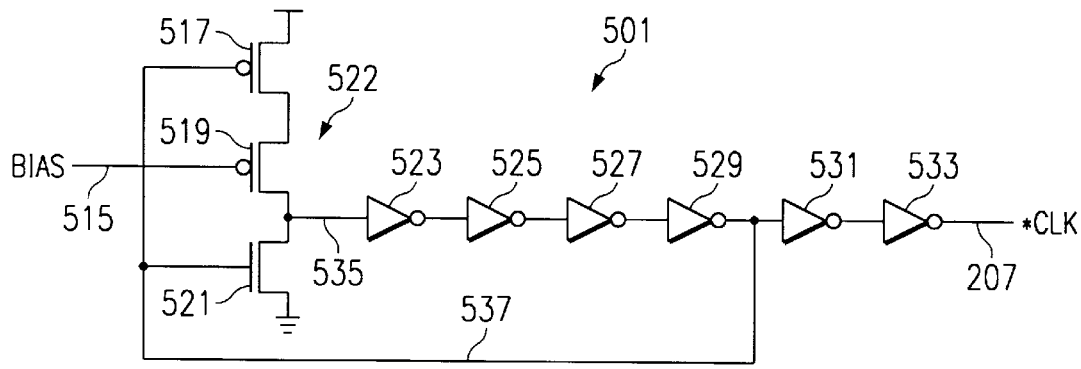
Figure 5C:
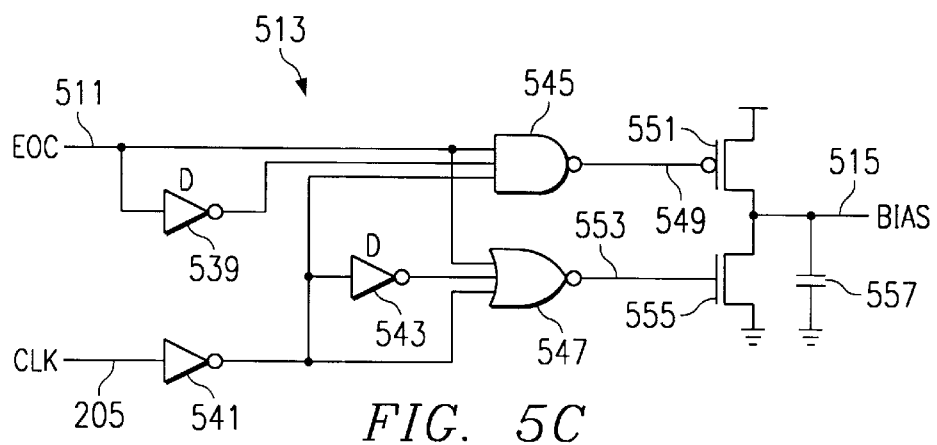

Yet another embodiment of the clock multiplier circuit will be explained with reference to FIG. 5A–5C. A voltage controlled oscillator circuit 501 (FIG. 5B) produces a multiplied clock signal *CLK having a frequency determined by the level of BIAS on lead 207. The multiplied clock signal CLK is conducted to internal clock signal IOCLK via CMOS pass gate 217 during parallel test operation. The multiplied clock signal *CLK is also applied to 2-bit counter circuit 503. Bit signals B0 and B1 from the 2-bit counter circuit are applied to NOR gate 509 to detect an end of count condition when both bits are low. The phase of this end of count condition is compared to the phase of system clock signal CLK by comparator circuit 513 (FIG. 5C). When the end of count signal EOC goes high prior to clock signal CLK, NAND gate 545 produces a low output pulse on lead 549. This low output pulse turns on transistor 551, thereby increasing the level of BIAS. Alternatively, when a low-to-high transition of clock signal CLK precedes end of count signal EOC, NOR gate 547 produces a high level pulse, thereby turning on transistor 555. Transistor 555 then conducts for the duration of the pulse to reduce the level of BIAS.

The voltage controlled oscillator circuit (FIG. 5B) includes a ring oscillator formed by five identical inverters 522–529. The circuit further includes two buffering inverters 531 and 533. Each identical inverter, for example inverter 522, receives the level of BIAS at the control gate of transistor 519. A lower level of BIAS increases the conductivity of transistor 519, thereby increasing the frequency of the ring oscillator. Alternatively, a higher level of BIAS decreases the conductivity of transistor 519, thereby decreasing the frequency of the ring oscillator.

Figure 7:
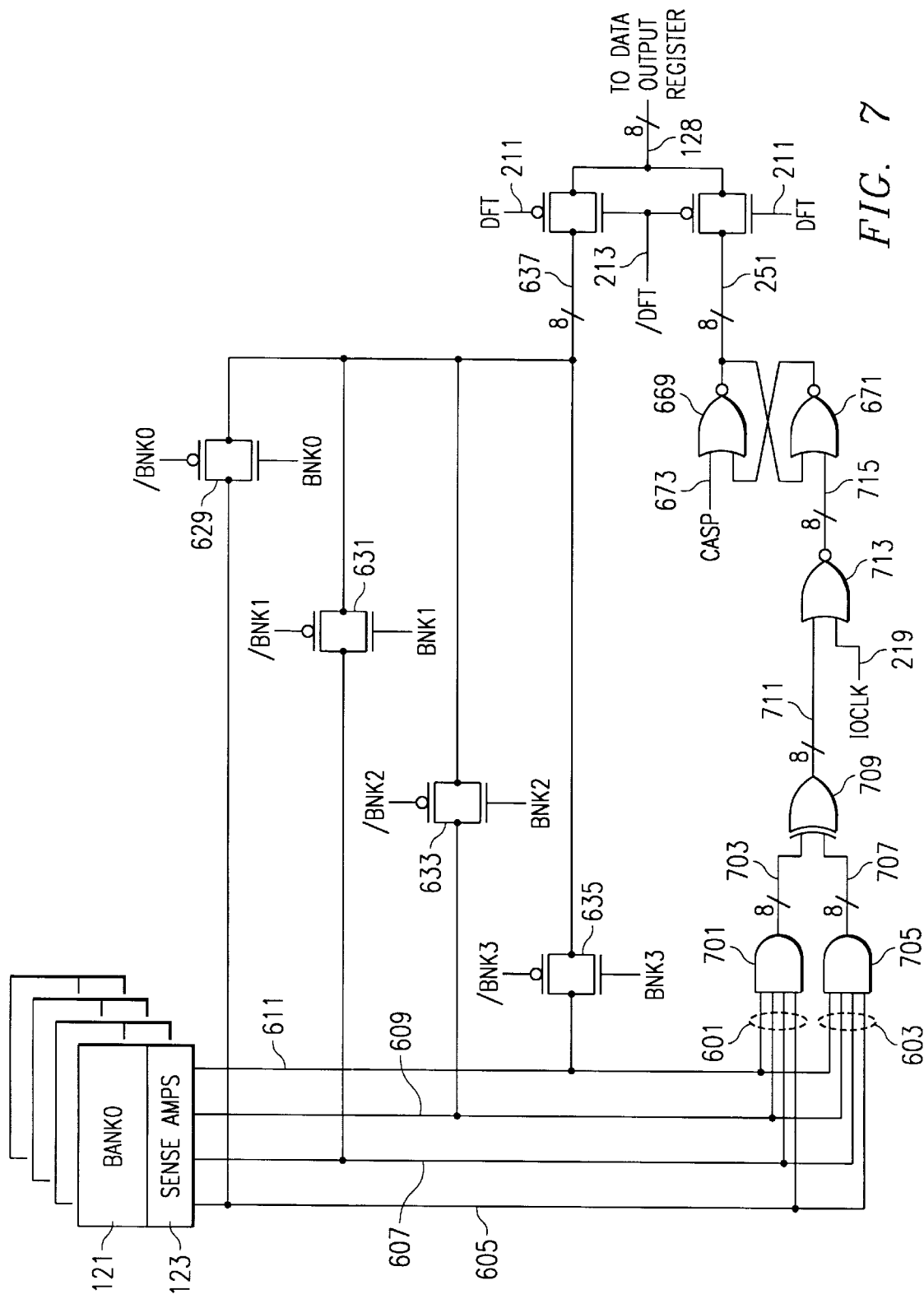
FIG. 7 is a schematic diagram of another embodiment of a data compression circuit of the present invention.

The inventive concept of the present invention need not compare data bits with reference bits. The circuit of FIG. 7 illustrates another embodiment of a data compression circuit of the present invention. The previously described Zt to Yt compression is performed by eight pairs of AND gates 701 and 705. The former produce a logical AND of a true state of respective data bits from each bank on bus 703. The latter produce a logical AND of a complementary state of the same respective data bits from each bank on bus 707. The signals on buses 703 and 707 are applied to eight respective XOR gates 709. Output signals from these XOR gates are applied to NOR gates 713 via bus 711. A high level signal from each XOR gate indicates a correct data state. A low level, however, indicates at least one data error. This error signal on bus 711 is inverted and applied to respective latches formed by cross-coupled NOR gates 669 and 671 in response to a low level of internal clock signal IOCLK as described previously. Thus, data compression and multiplied internal clock operation of the instant embodiment offers all the advantages of the previous embodiments without the need for a comparison with reference data bits.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit, comprising:
    a clock circuit coupled to receive a control signal having a first logic state and a second logic state, the clock circuit producing a first clock signal in response to the first logic state, the clock circuit producing a second clock signal in response to the second logic state, the second clock signal having a frequency at least twice a frequency of the first clock signal;
    an address counter coupled to receive one of the first and second clock signals, the address counter producing a sequence of address signals corresponding to the one of the first and second clock signals;
    an array of memory cells arranged to produce a sequence of data bits corresponding to the sequence of address signals; and
    a logic circuit coupled to receive the sequence of data bits, the logic circuit arranged to produce a logical combination of the sequence of data bits.

2. A circuit as in claim 1, wherein the control signal is a test signal.

3. A circuit as in claim 2, wherein the second clock signal frequency is an integral multiple of the first clock signal frequency.

4. A circuit as in claim 3, further comprising a plurality of data terminals corresponding to a data word, each terminal of the plurality of terminals corresponding to a respective bit position of the data word, wherein each data bit of the sequence of data bits corresponds to one said respective bit position.

5. A circuit as in claim 1, wherein the array of memory cells further comprises a first and a second bank of memory cells and wherein the sequence of data bits comprises a first and second sequence of data bits from each respective bank, each data bit from the first sequence corresponding in time to a data bit from the second sequence and wherein the logical combination includes each data bit from each of the first and second sequence.

6. A circuit as in claim 1, wherein the logical combination comprises a first logical combination of each data bit and a second logical combination of each data bit.

7. A circuit as in claim 6, wherein the logical combination further comprises a third logical combination of one of the first and second logical combinations with a corresponding sequence of reference data bits.

8. A circuit as in claim 6, wherein the circuit produces a first logic state at an output terminal in response to a pass condition and produces a second logic state at the output terminal in response to a fail condition.

9. A circuit as in claim 1, wherein the logical combination comprises a first logical combination of a true state of each data bit and a second logical combination of a complementary state of each data bit.

10. A circuit as in claim 9, wherein the logical combination is a parallel test result, a different first and second logical combination indicating a pass condition, a same first and second logical combination indicating a fail condition.

11. A circuit as in claim 9, wherein the circuit produces the logical combination at an output terminal in response to a pass condition and produces a complement of the logical combination at the output terminal in response to a fail condition.

12. A circuit, comprising:
    a clock circuit coupled to receive an external clock signal and a test signal, the test signal having a first logic state and a second logic state, the clock circuit producing a first clock signal having a frequency equal to a frequency of the external clock signal in response to the first logic state, the clock circuit producing a second clock signal in response to the second logic state, the second clock signal having a frequency at least twice the frequency of the first clock signal;
    an address counter coupled to receive one of the first and second clock signals, the address counter producing a sequence of address signals, each address signal corresponding to a cycle of the one of the first and second clock signals;
    an array of memory cells arranged to produce a sequence of data bits corresponding to the sequence of address signals; and
    a logic circuit coupled to receive the sequence of data bits, the logic circuit arranged to produce a logical combination of the sequence of data bits.

13. A circuit as in claim 12, wherein the second clock signal frequency is an integral multiple equal to twice the first clock signal frequency.

14. A circuit as in claim 12, further comprising a plurality of data terminals corresponding to a data word, each terminal of the plurality of terminals corresponding to a respective bit position of the data word, wherein each data bit of the sequence of data bits corresponds to one said respective bit position.

15. A circuit as in claim 12, wherein the array of memory cells further comprises a first and a second bank of memory cells and wherein the sequence of data bits comprises a first and second sequence of data bits from each respective bank, each data bit from the first sequence corresponding in time to a data bit from the second sequence and wherein the logical combination includes each data bit from each of the first and second sequence.

16. A circuit as in claim 12, wherein the logical combination comprises a first logical combination of each data bit and a second logical combination of each data bit.

17. A circuit as in claim 16, wherein the logical combination further comprises a third logical combination of one of the first and second logical combinations with a corresponding sequence of reference data bits.

18. A circuit as in claim 16, wherein the circuit produces a first logic state at an output terminal in response to a pass condition and produces a second logic state at the output terminal in response to a fail condition.

19. A circuit as in claim 12, wherein the logical combination comprises a first logical combination of a true state of each data bit and a second logical combination of a complementary state of each data bit.

20. A circuit as in claim 19, wherein the logical combination is a parallel test result, a different first and second logical combination indicating a pass condition, a same first and second logical combination indicating a fail condition.

21. A circuit as in claim 19, wherein the circuit produces the logical combination at an output terminal in response to a pass condition and produces a complement of the logical combination at the output terminal in response to a fail condition.

* * * * *

UNITED STATES PATENT AND TRADEMARK OFFICE
CERTIFICATE OF CORRECTION

PATENT NO    :   6,069,829
DATED        :   May 30, 20000
INVENTOR(S)  :   Yutaka Komai, Roger Norwood, and Daniel B. Penney It is certified that an error appears in the above-identified patent and that said Letters Patent is hereby corrected as shown below:

The exact page and line number where the error is visible in the application filed is found on the cover page, line number [75]. The inventor's last name is incorrectly spelled. Please correct to read -- DANIEL B. PENNEY --.

Signed and Sealed this

Twentieth Day of March, 2001

Attest:

NICHOLAS P. GODICI

Attesting Officer        Acting Director of the United States Patent and Trademark Office